United States Patent
Marbella

(10) Patent No.: US 9,343,397 B2
(45) Date of Patent: May 17, 2016

(54) METHOD OF CONNECTING A SEMICONDUCTOR PACKAGE TO A BOARD

(71) Applicant: Infineon Technologies AG, Neubiberg (DE)

(72) Inventor: Carlo Marbella, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 1 day.

(21) Appl. No.: 14/191,494

(22) Filed: Feb. 27, 2014

(65) Prior Publication Data
US 2015/0243593 A1 Aug. 27, 2015

(51) Int. Cl.
| H01L 21/44 | (2006.01) |
| H01L 23/498 | (2006.01) |
| H01L 23/00 | (2006.01) |
| H05K 1/11 | (2006.01) |
| H05K 3/34 | (2006.01) |

(52) U.S. Cl.
CPC .......... *H01L 23/49816* (2013.01); *H01L 24/17* (2013.01); *H01L 24/81* (2013.01); *H05K 1/111* (2013.01); *H05K 3/3436* (2013.01); *H01L 2224/14131* (2013.01); *H01L 2224/14135* (2013.01); *H01L 2224/14136* (2013.01); *H01L 2224/14179* (2013.01); *H01L 2224/14517* (2013.01); *H01L 2224/16106* (2013.01); *H01L 2224/1705* (2013.01); *H01L 2224/81815* (2013.01); *H05K 2201/10734* (2013.01)

(58) Field of Classification Search
CPC ............. H01L 2924/01078; H01L 2224/3225; H01L 2224/73267; H01L 2224/8203; H01L 2224/04105; H01L 2224/24226; H01L 2224/92244
USPC ......... 438/613, 124, 106, 107, 108–109, 112, 438/113, 127; 257/737–738
See application file for complete search history.

(56) References Cited

U.S. PATENT DOCUMENTS

2007/0023910 A1 2/2007 Beddingfield

FOREIGN PATENT DOCUMENTS

WO 0224391 A1 3/2002

*Primary Examiner* — Hoa B Trinh
(74) *Attorney, Agent, or Firm* — Murphy, Bilak & Homiller, PLLC

(57) ABSTRACT

A method of connecting a semiconductor package to a board includes providing a board having a plurality of contact regions, providing a semiconductor package having a plurality of contact areas, selecting a specific contact area out of the plurality of contact areas, applying solder balls to the contact areas and therein applying two or more specific solder balls to the specific contact area, and connecting the semiconductor package to the board in such a way that the two or more specific solder balls are connected with each other and with a contact region of the plurality of contact regions of the board.

10 Claims, 4 Drawing Sheets

METHOD OF CONNECTING A SEMICONDUCTOR PACKAGE TO A BOARD

TECHNICAL FIELD

The present invention relates to a method of connecting a semiconductor package to a board and to a semiconductor package.

BACKGROUND

The fabrication of semiconductor devices begins normally with the patterning of various features on and into semiconductor wafers. Afterwards the processed semiconductor wafers are singulated into semiconductor dies. In order to facilitate the attachment of these semiconductor dies to boards like printed circuit boards (PCB) and to protect the semiconductor dies, the semiconductor dies are typically assembled into packages before connecting them to a PCB. Up to now different types of semiconductor packages have been developed, one of which is the ball grid array (BGA) package. A BGA package connects to a PCB through an array of solder balls, which take the place of the pins of the solder pin-grid array packages.

Semiconductor packages often undergo reliability stress tests in which, for example, PCB-mounted BGA packages are typically subjected to temperature cycle testing, in particular the so-called Temp-cycle-on-Board (TCOB). These tests provide an indication on how the semiconductor device will perform in the field. Special semiconductor packages, in particular in automotive applications, are facing continuously increasing TCOB requirements. One important point of failure for BGA packages in TCOB testing is the solder ball connections. For improving the reliability of package to board connections, it is therefore important to improve the condition and reliability of solder ball connections.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
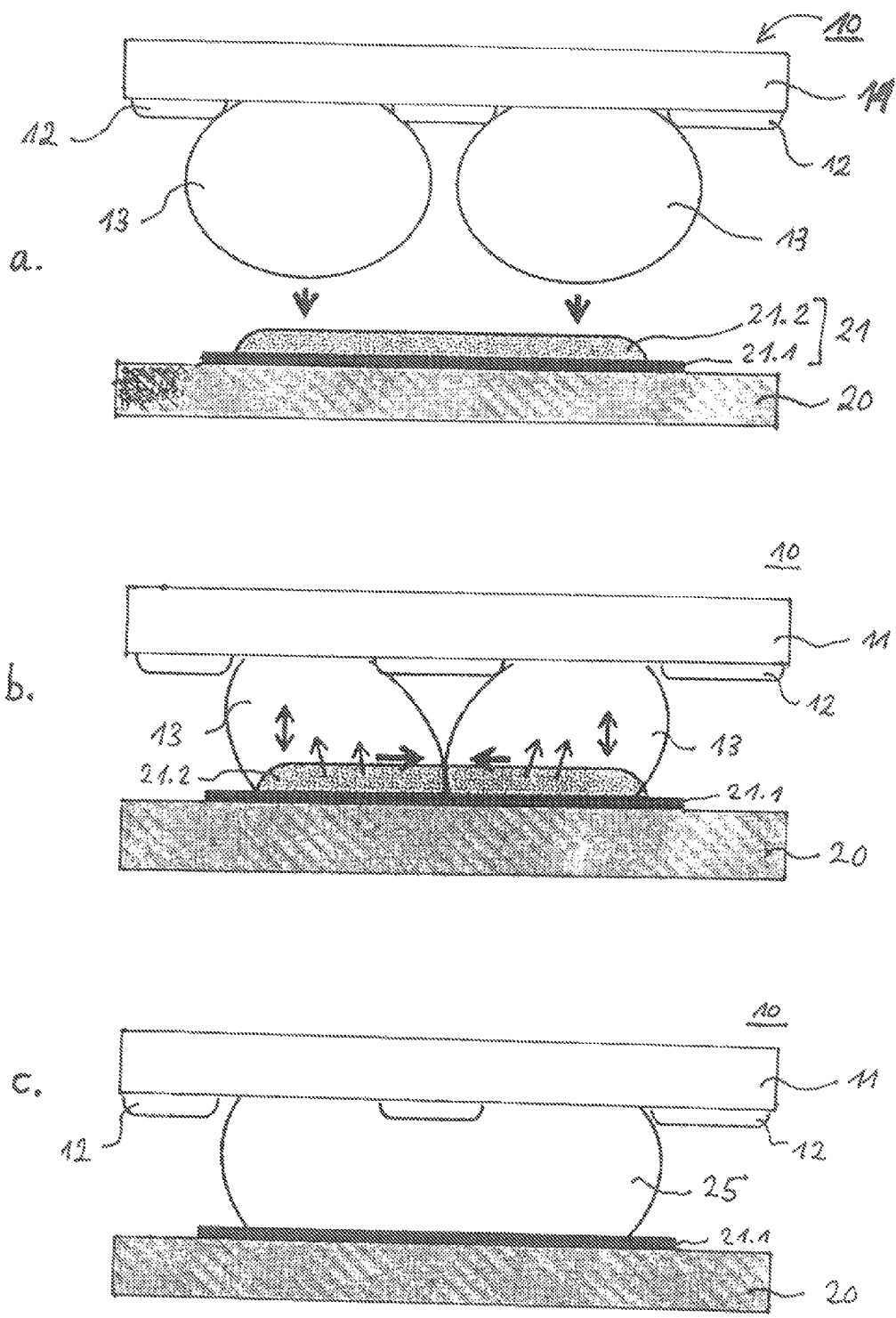
FIGS. 1a-c show schematic cross-sectional side view representations for illustrating a method of connecting a semiconductor package to a board according to an example, wherein the depicted section of the semiconductor package comprises two solder balls and the depicted section of the board comprises one contact region.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The examples of a method of connecting a semiconductor package to a board and of a semiconductor package may use various types of semiconductor chips incorporated in the semiconductor package. The examples may use logic chips like, for example, micro-controller or micro-processor chips as well as memory chips or chips incorporating particular devices like transistors or diodes. The semiconductor package may also comprise an encapsulant or encapsulating material having the semiconductor chip embedded therein. The encapsulating material can be any electrically insulating material like, for example, any kind of molding material, resin material, epoxy material, polymer material, polyimide material, thermoplast material, silicone material, ceramic material, and glass material.

The examples of a semiconductor package may include a ball grid array on a main face of the semiconductor package. The ball grid array may comprise solder balls of any desired and appropriate material composition. The solder balls may have a reflow temperature below 300° C., more specifically below 260° C. Solder ball compositions may include Sn—Pb solder and lead-free solders such as alloys of Sn with one or more of Ag, Cu, Sb, In, Zn, Ni, Cr, Co, Fe, O, Ge, and Ga.

FIGS. 1a-c show schematic cross-sectional side view representations for illustrating a method of connecting a semiconductor package to a board according to an example. The figures show a section of a semiconductor package 10 comprising a package substrate 11, a solder resist layer 12, and solder balls 13 attached to the package substrate 11 within openings of the solder resist layer 12. Also shown is a section of a printed circuit board (PCB) 20 comprising a contact region 21 composed of a pad 21.1 and a solder paste 21.2 applied onto the pad 21.

FIG. 1a shows a first stage of the method in which the semiconductor package 10 is brought in a position above the printed circuit board 20 so that the solder balls 13 are located above the contact region 21. The arrows indicate that the semiconductor package 10 is moved downwards so that the solder balls 13 come into mechanical contact with the upper surface of the contact region 21, in particular the upper surface of the solder paste 21.2.

FIG. 1b shows a second stage of the method in which the solder balls 13 were brought into contact with the contact region 21, i.e. with the upper surface of the solder paste 21.2 and thereafter a temperature is set such that a reflow process is initiated. Depending on the material of the solder balls 13 and the solder paste 21.2, the reflow temperature can be in a range between room temperature and 300° C., more specifically between room temperature and 260° C. The reflow process involves a flow of material between the solder balls 13 and between each one of the solder balls 13 and the solder paste 21.2 as it is indicated by the various arrows in FIG. 1b.

FIG. 1c shows that, as a result of the reflow process, a large joint area 25 ("joint-solder-joint") is generated between the package substrate 11 and the pad 21.1. With this method a wider solder joint can be created than obtainable with standard individual joints. The wider solder joint would result to longer TCOB life because the TCOB induced solder microcracks within the joint-solder-joint have longer path to traverse to effect a complete crack failure. The joint area 25 comprises a larger planar area solder joint at both package-side and board-side than a standard individual joint. The solder joint is normally limited by the amount of stress or strain that can be withstood by the solder size. Since the size of the joint area 25 is about twice as large than the size of a standard individual solder joint, the stress or strain can be significantly reduced. The method may use a standard package-to-PCB placement and reflow process without any additional process step. Also the ball coplanarity can be maintained on the package level which means that there will be no effect to packages solder balls contact to the pads 21.1 of the PCB 20 including the solder paste 21.2. The process can be carried out on a standard PCB 20 wherein the semiconductor package 10 may have either a solder resist opening which is solder mask defined (SMD) or a solder resist opening which is non-solder mask defined (NSMD).

According to an example of the method of FIG. 1, the semiconductor package 10 comprises a plurality of contact areas and the area, in which the solder balls 13 are applied to the semiconductor package 10, is selected as a specific contact area out of the plurality of contact areas. The solder balls 13 as shown in FIGS. 1a-c can also be called "specific solder balls" as they are applied to the specific contact area. It is also possible to apply not only two but also more than two specific solder balls to the specific contact area. It is furthermore possible to select not only one specific contact area out of the plurality of contact areas but two or more specific contact areas out of the plurality of contact areas. In particular in the case of a semiconductor package comprising a rectangular or quadratic main face, four specific contact areas can be selected out of the plurality of contact areas, wherein each one of the four specific contact areas is located adjacent to one of the four corners of the main face or adjacent to one of the centers of the four side edges of the main face. Examples thereof will be shown below.

According to an example of the method of FIG. 1 a minimum distance between the specific solder balls is set such that it is less than a minimum distance between all other solder balls. In particular, a minimum distance between the specific solder balls can be set such that in a reflow process with an underlying solder paste of a contact region of a board the solder balls will be merged into each other.

According to an example of the method of FIG. 1, the semiconductor package 10 comprises a main face, the contact areas being disposed at the main face, and a solder resist layer 12 is applied to the main face, wherein openings are formed in the solder resist layer 12 above the contact areas wherein a number of openings is formed in the solder resist layer 12 above the specific contact area, the number of openings corresponding to the number of specific solder balls to be applied thereafter.

According to an example of the method of FIG. 1, the contact regions 21 of the board 20 can be formed as homogenous and contiguous regions. The contact regions 21 may also comprise a pad 21.1 and a solder paste 21.2 applied onto the pad. It is also possible that the contact regions 21 are only made up of a flat region of solder paste applied onto the upper surface of the PCB 20.

According to an example of the method of FIG. 1, the specific solder balls are first contacted with the contact region and then heating to a reflow temperature is carried out. The reflow temperature can be in a range from room temperature to 300° C. depending on the material of the solder balls. Furthermore, before heating uncured polymer material can be applied to the solder balls. The polymer material can be applied in the form of a polymer collar onto the solder balls. The polymer material may fulfill the function of an enforcement flux on the solder balls which strengthens the package-side of the joint resulting in an even more robust solder-joint.

According to an example of the method of FIG. 1, the material of the specific solder balls can be equal to the material of all the other (non-specific) solder balls. It is, however, also possible to select another material of the specific solder balls as compared to the non-specific solder balls.

According to an example of the method of FIG. 1, the specific solder balls have no electrical functionality in a sense that they are not connected with the electrical circuitry of the semiconductor chip embedded within the semiconductor package 10. Accordingly, the only purpose of the specific solder balls is to improve the overall mechanical properties of the solder joint connection between the semiconductor package 10 and the PCB 20. Accordingly, it is possible that in the specific contact area there are no electrical contact pads on the main face of the semiconductor package or there are only dummy pads applied on the main face of the semiconductor package, the dummy pads not being electrically connected with the semiconductor chip and the specific solder balls being connected with the dummy pads.

According to another example of the method of FIG. 1, the specific solder balls do have electrical functionality, which means that they are electrically connected with the semiconductor chip, i.e. the specific solder balls are connected with electrical contact pads disposed within the specific contact area wherein the electrical contact pads are electrically connected with the semiconductor chip. It is also possible that some ones of the specific solder balls have electrical functionality and some other ones of the specific solder balls have no electrical functionality.

According to an example of the method of FIG. 1, two, three or four specific solder balls can be applied to the specific contact area. In the case of, for example, three or four specific solder balls, they can be arranged in a regular manner. In the case of three specific solder balls they can be arranged on the corners of a triangle and in the case of four specific solder balls they can be arranged on the corners of a square. Examples thereof will be shown below.

According to an example of the method of FIG. 1, one or more of the size and diameter of the specific solder balls can be the same as the size or diameter of the other, non-specific solder balls. It is, however, also possible that one or more of the size and diameter of the specific solder balls can be different from the size and diameter of the other, non-specific solder balls. In particular, one or more of the size and diameter of the specific solder balls can be smaller or larger than the size or diameter of the other, non-specific solder balls.

According to an example of the method of FIG. 1, a ratio of minimum center-to-center distance between two specific solder balls to diameter of the solder balls is less than 2.5, more specifically less than 2.0, more specifically less than 1.5.

Figure 2:
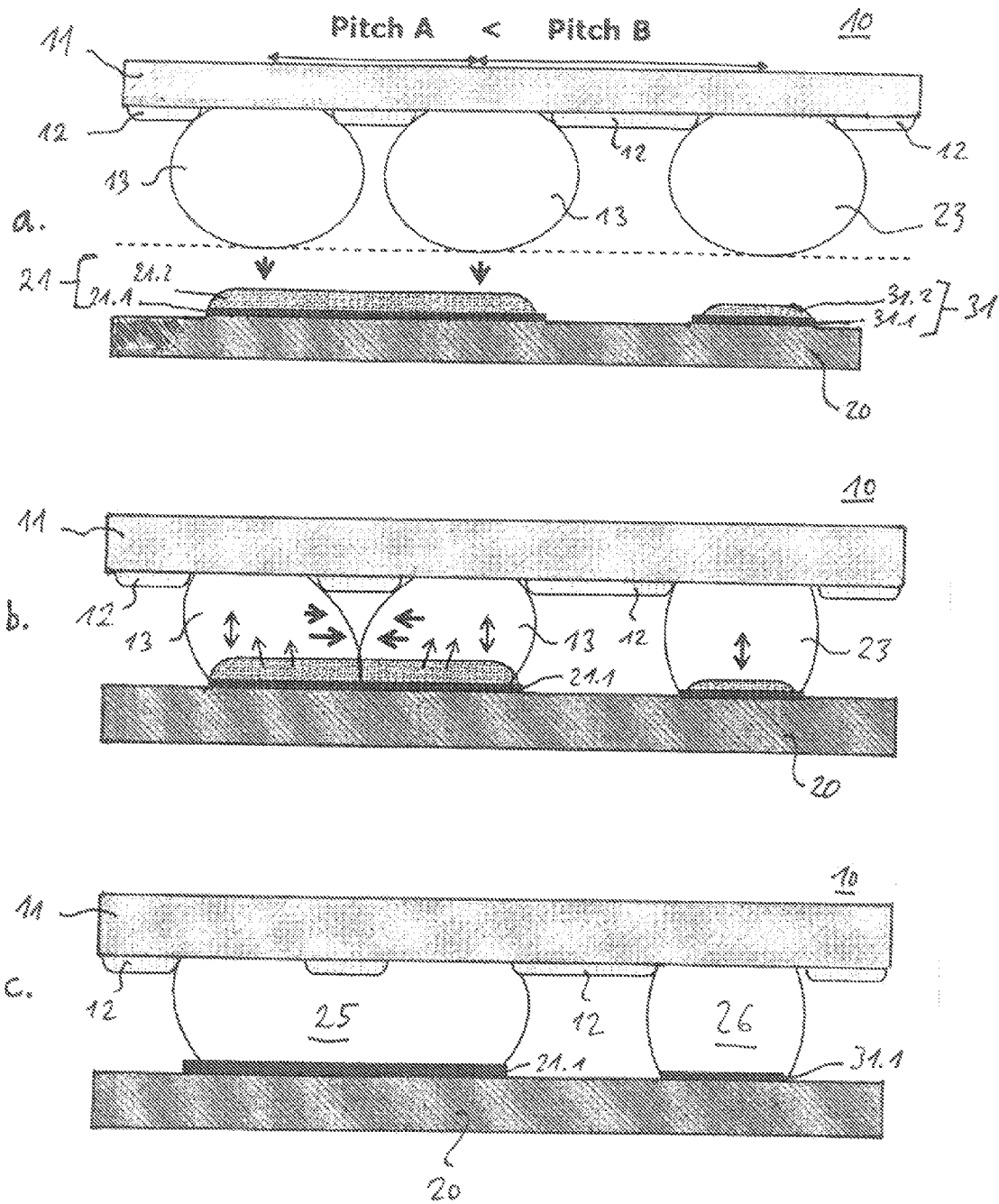
FIGS. 2a-c show schematic cross-sectional side view representations for illustrating a method of connecting a semiconductor package to a board according to an example, wherein the depicted section of the semiconductor package comprises three solder balls and the depicted section of the board comprises two contact regions.
Figure 3:
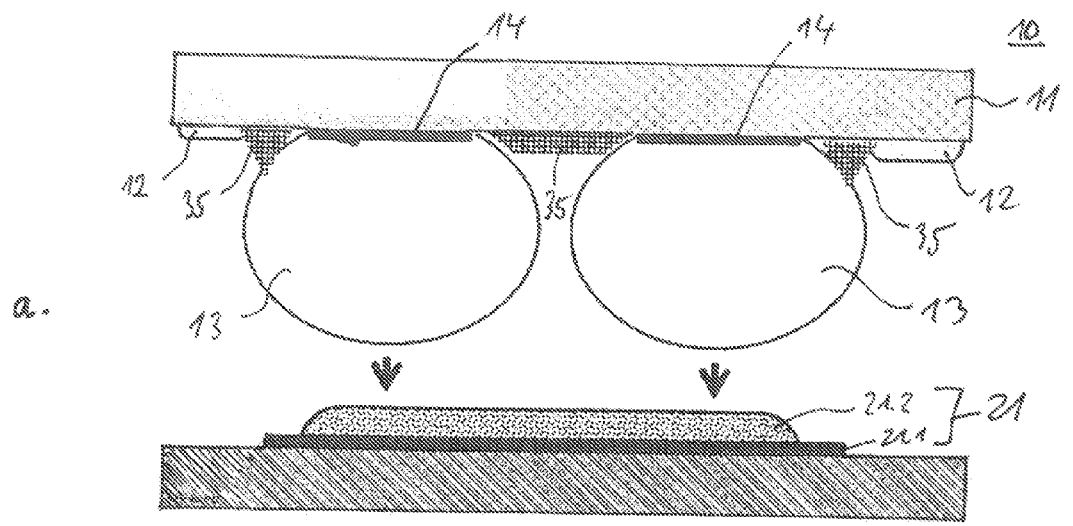
FIGS. 3a-c show schematic cross-sectional side view representations for illustrating a method of connecting a semiconductor package to a board according to an example, wherein the depicted section of the semiconductor package comprises two solder balls and the depicted section of the board comprises one contact region and each one of the solder balls are applied to a contact pad and uncured polymer material is applied to the solder balls.
Figure 3:
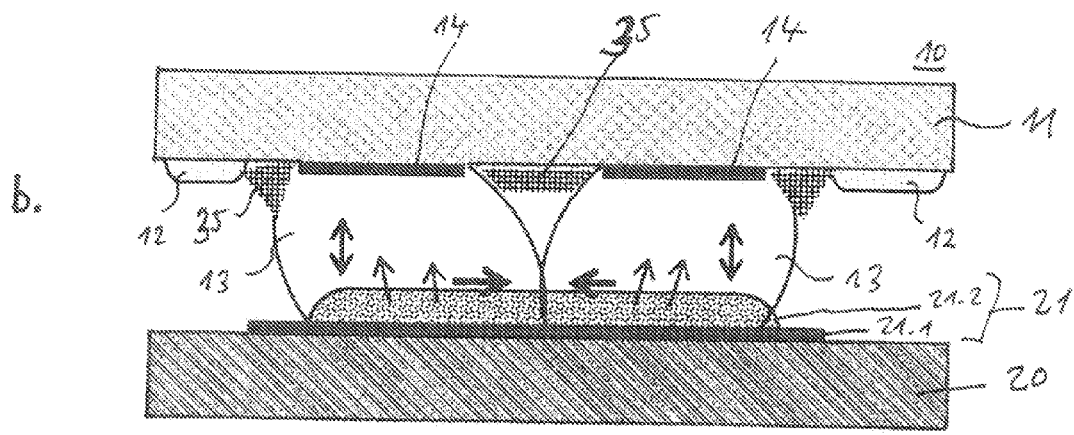
Figure 3:
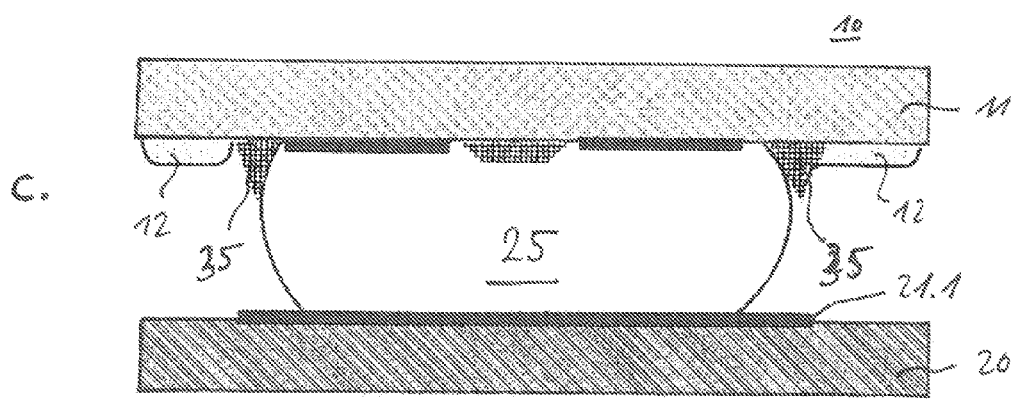

FIGS. 2a-c show schematic cross-sectional side view representations for illustrating a method of connecting a semiconductor package to a board according to an example. As compared with FIGS. 1a-c, a larger section of the semiconductor package 10 and of the printed circuit board 20 is shown, wherein on the right-hand side a further contact area of the semiconductor package 10 is shown comprising a further non-specific solder ball 23. All other details of FIGS. 2a-c are similar to those of FIGS. 1a-c and thus carry the same reference numbers. FIGS. 2a-c essentially show that the specific solder balls 13 have a minimum center-to-center distance (pitch A) which is smaller than a nearest center-to-center distance (pitch B) between one of the specific solder balls 13 to a non-specific solder ball 23 or also between any other two of the non-specific solder balls. FIGS. 2a-c also show that the specific solder balls 13 are applied to a contact region 21 which comprises a solder paste 21.2 having a volume A, and the non-specific solder ball 23 is applied to another contact region 31 comprising a pad 31.1 and a solder paste 31.2 having a volume B wherein A is greater than B. The dashed line in FIG. 2a indicates the coplanarity of lowermost surfaces of the specific solder balls 13 and the non-specific solder ball 23. As a result a large joint area 25 is generated between the left-sided specific contact area and the PCB 20 and a normal-size joint area 26 is generated between the right-side non-specific contact area and the PCB FIGS. 3a-c show schematic cross-sectional side view representations for illustrating a method of connecting a semiconductor package to a board according to an example. The example of FIGS. 3a-c is similar to the one of FIGS. 1a-c and differs only in that uncured polymer material 35 is applied to the specific solder balls 13. The polymer material 35 is applied in the form of a polymer collar to the solder balls 13. The solder balls 13 are, in this case, applied to contact pads 14 disposed on the main face of the semiconductor package 10. The contact pads 14 can be dummy pads which means that there is no electrical connection between the dummy pads 14 and the semiconductor chip embedded in the semiconductor package 10. Alternatively the pads 14 can also be connected with the semiconductor chip which means that the pads 14 are electrically connected with each other. The polymer material 35 can also be applied in-between the solder balls 13 so that it replaces the solder resist layer which is applied between the solder balls 13 in the examples of FIGS. 1a-c and FIGS. 2a-c.

The material 35 fulfills the function of an enforcement flux. The purpose of the enforcement flux at the package solder balls is to distribute the solder joint stress, resulting to longer life of the package side-joint. Enforcement flux could also be used on large solder balls on tight pitch and in the case of non-solder masked defined solder resist openings. The solder balls 13 may have a diameter of 500 µm, wherein the center-to-center distance between the solder balls 13 can be about 800 µm, so that the ratio of minimum distance to diameter is less than 2.

The combination of enforcement flux in the form of the polymer material 35 on the package-side of the joint and the wide joint area creates a high robust joint for high TCOB cycling life.

FIGS. 4a-e show different examples of semiconductor packages (left column) and corresponding PCB pad design configurations (right column). In the semiconductor packages the shaded areas designate specific solder balls and in the PCB designs the shaded areas designate contact regions intended to be connected with the specific solder balls of the semiconductor packages. The semiconductor packages are shown to have a quadratic shape.

Figure 4:
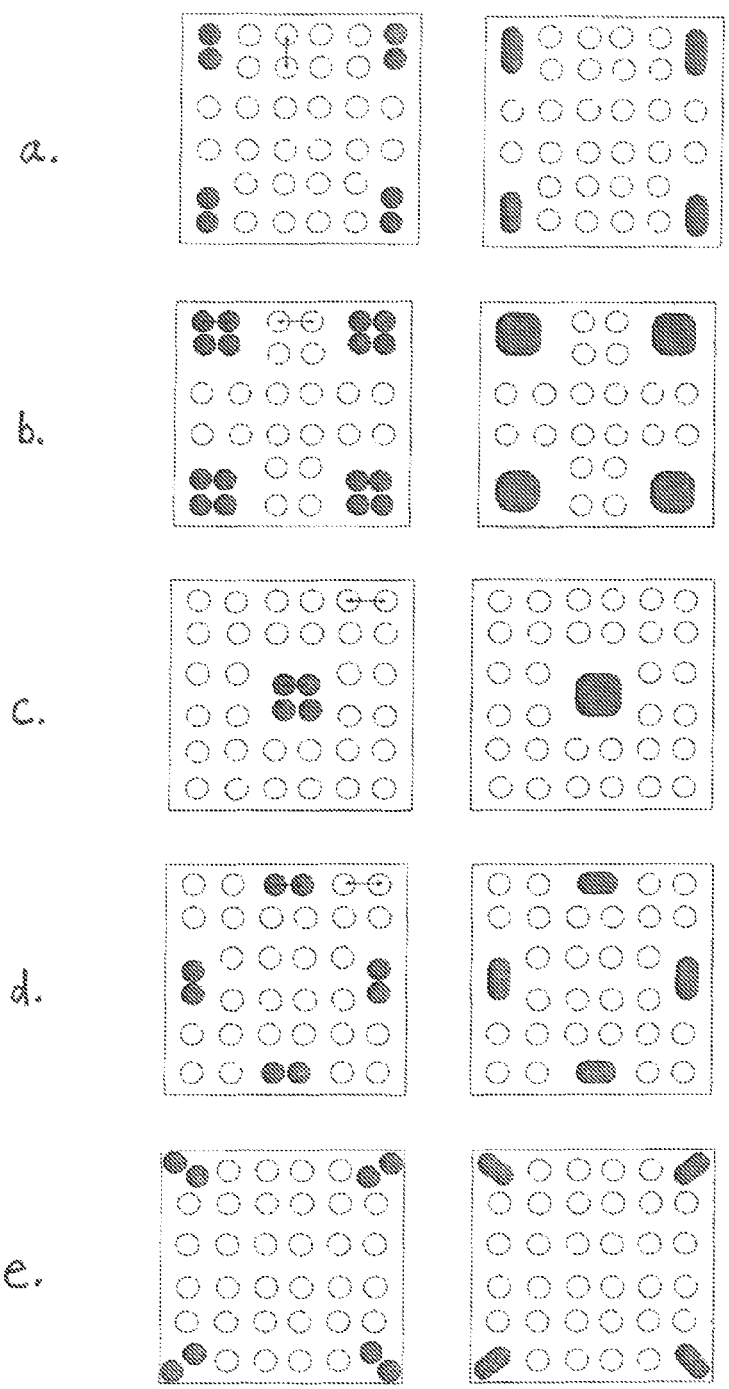
FIGS. 4a-e show in the left column schematic down view representations of different examples of semiconductor packages and in the right column the corresponding top view representations of different examples of printed circuit boards with their respective configurations of contact regions.

FIG. 4a shows a semiconductor package comprising four groups of specific solder balls, each one of the four groups being disposed in or adjacent to one of the four corners of the quadratic layout. Each group consists of two specific solder balls which are aligned in a vertical direction. There are also shown arrows drawn between specific solder balls indicating pitch A wherein arrows drawn between non-specific solder balls indicate pitch B. The center-to-center distance (pitch A) between the two specific solder balls of each group is less than the minimum center-to-center distance (pitch B) between other, non-specific solder balls of the ball grid array.

FIG. 4b shows a semiconductor package being similar to the semiconductor package of FIG. 4a, wherein each group of specific solder balls contains four specific solder balls arranged in a square form.

FIG. 4c shows a semiconductor package comprising only one specific contact area disposed in the center of the package and containing four specific solder balls arranged in a square form.

FIG. 4d shows a semiconductor package comprising again four groups of specific solder balls, each one of the groups containing two specific solder balls wherein the groups of solder balls are disposed in or adjacent to the centers of the four side edges of the quadratic semiconductor package.

FIG. 4e shows a semiconductor package comprising four groups of specific solder balls, each one of the groups of specific solder balls containing two specific solder balls wherein each one of the groups is disposed in or adjacent to the four corners of the quadratic semiconductor package. The specific solder balls in each group are aligned in such a way that a line connecting the centers of the specific solder balls essentially points to the center of the quadratic semiconductor package.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method of connecting a semiconductor package to a board, the method comprising:
   providing a board, the board comprising a plurality of contact regions;
   providing a semiconductor package, the semiconductor package comprising a plurality of contact areas;
   selecting a specific contact area out of the plurality of contact areas;
   applying solder balls to the contact areas and therein applying two or more specific solder balls to the specific contact area; and
   connecting the semiconductor package to the board in such a way that the two or more specific solder balls are connected with a contact region of the plurality of contact regions of the board and are merged into each other forming a joint solder joint.

2. The method according to claim 1, further comprising:
   selecting two or more specific contact areas out of the plurality of contact areas.

3. The method according to claim 2, wherein the semiconductor package comprises a rectangular or quadratic main face, the method further comprising:
   selecting four specific contact areas, wherein
   each one of the four specific contact areas is located adjacent to one of the four corners of the main face or adjacent to one of the centers of the four side edges of the main face.

4. The method according to claim 1, wherein a minimum distance between the two or more specific solder balls is less than a minimum distance between all other solder balls.

5. The method according to claim 1, wherein the semiconductor package comprises a main face and the contact areas are disposed at the main face, the method further comprising:
   applying a solder resist layer to the main face, wherein openings are formed in the solder resist layer above the contact areas wherein a number of openings is formed in the solder resist layer above the specific contact area, the number of openings corresponding to the number of specific solder balls to be applied thereafter.

6. The method according to claim 1, further comprising:
   applying a solder paste to the contact regions of the board.

7. The method according to claim 1, wherein connecting the semiconductor package to the board comprises:
   contacting the two or more specific solder balls with the contact region or a solder paste applied onto the contact region; and
   heating to a reflow temperature.

8. The method according to claim 7, further comprising:
   heating to a reflow temperature in a range from room temperature to 300° C.

9. The method according to claim 7, further comprising:
   applying uncured polymer material to the solder balls before heating.

10. A method of connecting a semiconductor package to a board, the method comprising:
    providing a board, the board comprising a plurality of contact regions;
    providing a semiconductor package, the semiconductor package comprising a plurality of contact areas;
    selecting a specific contact area out of the plurality of contact areas;
    applying solder balls to the contact areas and therein applying two or more specific solder balls to the specific contact area; and
    connecting the semiconductor package to the board in such a way that the two or more specific solder balls are electrically connected with each other and with a contact region of the plurality of contact regions of the board.

* * * * *